United States Patent
Tsunoda et al.

[11] 3,944,330
[45] Mar. 16, 1976

[54] ELECTRO-OPTIC DEVICE

[75] Inventors: Ichiro Tsunoda; Satoshi Takeuchi, both of Kawasaki; Yoichiro Hirao, Tokyo; Takeo Suzuki, Tokyo; Yoshihiro Nishiue, Tokyo; Katsumasa Tadokoro, Tokyo; Toshimasa Fukagawa, Tokyo; Isamu Harada, Warabi; Akira Misawa; Kazuo Watanabe, both of Tokyo, all of Japan

[73] Assignee: Dainippon Printing Co., Ltd., Tokyo, Japan

[22] Filed: Sept. 21, 1973

[21] Appl. No.: 399,481

[30] Foreign Application Priority Data
| Sept. 22, 1972 | Japan | 47-95497 |
| Oct. 6, 1972 | Japan | 47-100394 |
| Oct. 6, 1972 | Japan | 47-100395 |
| Nov. 18, 1972 | Japan | 47-115880 |
| Jan. 25, 1973 | Japan | 48-11406[U] |
| Feb. 10, 1973 | Japan | 48-16941 |
| Feb. 22, 1973 | Japan | 48-21640 |

[52] U.S. Cl. .................. 350/160 LC; 350/150
[51] Int. Cl.² .............................. G02F 1/13
[58] Field of Search ........... 350/160 LC, 150, 160 R

[56] References Cited
UNITED STATES PATENTS
| 3,512,826 | 5/1970 | Marks | 350/160 LC X |
| 3,612,654 | 10/1971 | Klein | 350/160 LC |
| 3,647,280 | 3/1972 | Klein et al. | 350/160 LC |
| 3,667,039 | 5/1972 | Garfein et al. | 350/160 LC |
| 3,674,342 | 7/1972 | Castellano et al. | 350/160 LC |
| 3,680,950 | 8/1972 | Haas et al. | 350/160 LC X |
| 3,772,874 | 11/1973 | Lefkowitz | 350/160 LC X |
| 3,774,195 | 11/1973 | Schulthess et al. | 350/160 LC X |
| 3,785,721 | 1/1974 | Harsch | 350/160 LC X |

OTHER PUBLICATIONS

Lechner et al., "Liquid Crystal Matrix Displays" *Proc. IEEE*, Vol. 59, No. 11, pp. 1566–1579, Nov. 1971.
Ludeman et al., "Liquid Crystal Cell . . ." *IBM Tech. Discl. Bull.* V-15, No. 4, Sept. 1972, pp. 1349–1350.

*Primary Examiner*—Alfred E. Smith
*Assistant Examiner*—Matthew W. Koren
*Attorney, Agent, or Firm*—D. Gordon Angus; Donald D. Mon

[57] ABSTRACT

An electro-optic device comprises a plurality of first electrodes provided on a top substrate and a second electrode provided on a bottom substrate, the first electrodes confronting the second electrode through electro-optical matter which will show electro-optical phenomena by the application of electric field, the first and second electrodes being connected through electrical elements such as resistors or capacitors to a variable voltage source. In this electro-optic device, the electric field applied between the first and second electrodes are partially changed by various means, for instance, by making the areas of the first electrodes different, or by varying the values of the electrical elements such as resistors or capacitors, as a result of which the electro-optical matter shows various electro-optical phenomena.

4 Claims, 22 Drawing Figures

ELECTRO-OPTIC DEVICE

BACKGROUND OF THE INVENTION

This invention relates to an electro-optic device used for various display devices which display an image having a monochrome and/or colored tone partially light and shade or to an electro-optic device useful for optical valves, shades or screens.

Various electro-optical devices which present or show a peculiar electro-optical phenomenon in a relatively low electric field are well known in the art. Such electro-optical devices can be divided into two groups; one group including so-called crystalline liquids, that is, some of the organic substances presenting mesophase indicating that they are states of matter intermediate between the liquid and crystalline states or mixtures of these organic substances and the other group including so-called colloidal liquids which are obtained by dispersing a non-organic crystal such as tungsten oxide and vanadium oxide or an anisotropic crystal such as herapathite in a solvent, a typical one of which is the colloidal liquid on the market named VARAD (made by MARKS POLARIZED CO.)

When an electric field is applied to such an electro-optical matter, for instance a crystalline liquid; in one case, it changed its state, that is, it changes from a state of presenting an optical isotropy to a state of presenting an optical anisotropy, and in another case, it changes from the state of presenting an optical isotropy to a state of a molecular turbulent flow thereby to uniformly scatter incident light. In addition, a certain type of crystalline liquid matter selectively reflects only the light of a particular wave length upon application of an electric field thereto.

Such peculiar optical properties of crystalline liquid matter are utilized in a conventional crystalline liquid display device known in the art. Such a conventional crystalline liquid display device is provided with a plurality of electrodes for optical image-creating, confronted each other, on both side of a crystalline liquid film wherein electric field has been properly selectively applied to these electrodes, thus selectively displaying a part of or the whole of the image, but it has never been tried to present a light and shade portion in the image or to display a plurality of colored images. Accordingly, what is displayed by the conventional crystalline liquid display device is limited to characters or simple figures.

The present invention is to solve such difficulties accompanying the conventional crystalline liquid display device. In this invention, its electrode is divided into a plurality of parts, external input voltages necessary for the occurrence of an electro-optical phenomenon in these parts thus divided being made different from one another thereby to display an image having various brightnesses and/or color tones different from one another in the parts.

SUMMARY OF THE INVENTION

Accordingly, it is a primary object of this invention to provide an electro-optic device serviceable as an indoor or outdoor decorative display showing a very impressive image in which a display having various brightnesses and/or a plurality of color tones different stepwise from each other is carried out, and not only simple characters and figures but also intricate pictures and patterns having various brightnesses and/or color tones can be displayed.

Another object of the invention is to provide an electro-optic device in which a display having a plurality of color tones different stepwise from one another is carried out so as to provide a map for indicating various levels such as a golf course map, a map for informing of areas where photochemical smog occurs and a weather chart for indicating areas of "fine weather" and "rainy weather" by distinguishing them by brightness and/or colors.

A further object of the invention is to provide an electro-optic device which can be readily fabricated at a low cost and can take place of an advertisement tower or neon sign board, in which a member for effecting an electro-optical action displays an image which varies with a delay time, or at time intervals, without the aid of an electrical or mechanical switching operation.

A still further object of the invention is to provide an electro-optic device which is suitable for a direction-indicating lamp of a vehicle, a passage guide board and an optically scanned light shutter such as an optical shade and a light blind.

A particular object of the invention is to provide an electro-optic device which is utilized as an indicator for indicating a value of voltage or current, such as for instance an extremely thin ammeter or voltmeter and indicators in various instrument for measuring temperature, speed, weight, quantity of light, pressure and the like in combination with appropriate transducers.

A more particular object of the invention is to provide an electro-optice device which is useful as a volume indicator, or a level indicator, of an acoustical device and more particularly as an indicator for indicating right and left sounds in a stereophonic device or a tuning indicator in a communication device.

According to an aspect of this invention, the foregoing objects and other objects have been achieved by the presentation of an electro-optic device in which a plurality of electrodes different in area from one another are arranged in order and connected respectively through resistors or capacitors having the same value to a variable voltage source so that the threshold values of voltages to be applied to the electrodes for the occurrence of electro-optical phenomena in an electro-optical matter are different from one another or in which a plurality of electrodes having the same area are connected respectively through resistors or capacitors different in value from one another in order that voltages between the electrodes are different from one another.

According to a further aspect of the invention, the foregoing objects and other objects have been achieved by the provision of an electro-optic device formed in such a manner that it has a plurality of sections where the areas of opposed electrodes are different from one another and a plurality of electrodes provided respectively in the sections are connected directly or through resistors or capacitors having the same value to a variable voltage source so that the threshold values of voltage for presenting electro-optical phenomena of electro-optical matter in the sections, respectively.

The manner in which the foregoing objects and other objects of this invention have been achieved will become more apparent from the following detailed description and the appended claims when read in conjunction with the accompanying drawings, in which like parts are designated by like reference numerals or symbols.

DETAILED DESCRIPTION OF THE INVENTION

Figure 1:
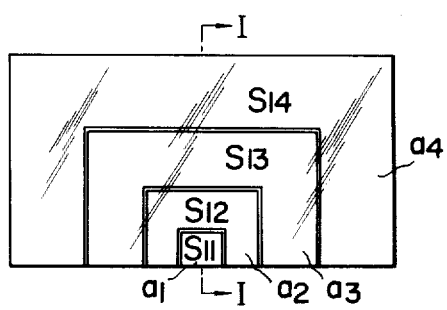
FIG. 1 is a plan view illustrating one example of this invention.
Figure 2:
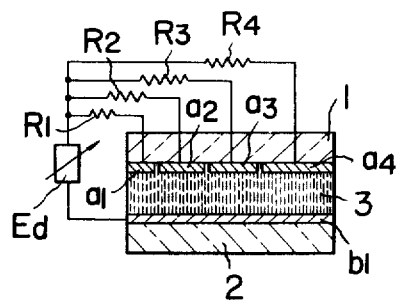
FIG. 2 is a cross-sectional view taken along line I—I in FIG. 1.

With reference now to FIGS. 1 and 2, there is shown one example of the electro-optic cell according to this invention, which comprises a top substrate 1 made of transparent glass or resin under which first electrodes $a_1, a_2 \ldots$ respectively having areas $S_{11}, S_{12} \ldots$ different from one another are arranged and a bottom substrate 2 made of transparent glass or resin on which a second electrode is provided. The top substrate 1 is stacked on the bottom substrate 2 so that the first electrodes $a_1, a_2 \ldots$ confront the second electrode $b_1$, while an electro-optic material 3 is filled between them.

The first electrodes $a_1, a_2 \ldots$ and the second electrode $b_1$ are formed by subjecting metals such as tin oxide and indium oxide or metallic compounds of these metals to various methods such as sputtering, vacuum evaporation and formation. The thickness of these electrodes is ordinarily on the order of from several hundreds to 2,000 A. In this connection, in the case of forming an electro-optic cell of reflection type, the second electrode $b_1$ is formed as a light reflecting film by vacuum-evaporating or printing a metal such as aluminum, chromium, gold and silver on the bottom substrate 2. If required, the second electrode $b_1$ may be formed by laminating a plurality of these metals so as to increase the strength of the light reflecting film.

In this connection, organic crystalline liquids or artificial crystalline liquids, that is, crystalline liquids whose properties are changed electrically and optically (that is, are electro-optically variable) and which are artificially produced by dispersing non-organic fine particles or organic fine particles into solvents can be employed as the electro-optical matter.

Nematic crystalline liquid matters such as listed below or mixture crystalline liquids containing two nematic crystalline liquid matters or more are available as the organic crystalline liquids:

Anisal-p-cyanoaniline, p-methylbenzal-p-buthylaniline, p-ethoxybenzal-p-cyanoaniline, p-cyanobenzal-p'-buthylaniline, p-cyanobenzalanisidine, p-cyanobenzalphenetidine, 4'-cyanophenyl-4-n-buthylbenzoate, 4'-cyanophenyl-4-n-hepthylbenzoate, ethyl-(p-anisalamino)-cinnamate, ethyl-p-(p-ethoxybenzalamino)-cinnamate, ethyl-(p-cyanobenzal)-cinnamate n-buthyl-(anisal-p-amino)-cinnamate, n-buthyl-p-ethoxybenzalamino)-cinnamate, isoamyl-(anisal-p-amino)-cinnamate, N-(48'-ethoxybenzal)-4-aminobenzonitrile, 4-(4'-n-hexylbenzalamino)-benzonitrile, 4-(4'-n-propylbenzalamino)-benzonitrile, p-azoxyanisole, 4-methoxy-4'-ethoxyazoxybenzene, anisal-p-aminophenylacetate, p-methoxybenzal-p'-n-buthylaniline, p-methoxyformyloxybenzal-p'-n-buthylaniline, N-)p-methoxybenzal)-p-(2-propoxycarbonyl-1-propenyl)-aniline, p-ethoxybenzal-p'-n-buthylaniline, p-methoxy-p'-n-penthylcarbonyl-oxyazobenzene, p-ethoxy-p'-buthoxycarbonylazobenzene, buthyl-p-(p-ethoxyphenoxycarbonyl)-phenylcarbonate, N-(4-methoxybenzal)-4'-0-n-buthylaminophenole, p-(p-ethoxyphenylazo)-phenylhexanoate, bis-(4-n-octhyloxylenzal)-2-chlorophenylenediamine, 4,4'-bis-(hexyloxy)-azoxybenzene, 4,4'-bis-(hepthyloxy)-azoxybenzene, 4-caproiloxybenzoicacid-4'-ethoxyphenylester, and 4-caproiloxybenzoicacid-4'-buthoxyphenylester.

As will be described later, in some cases a mixture prepared by mixing a small amount of cholesteric crystalline liquid material in a nematic crystalline liquid matter are employed as the electro-optical material, and sometimes a nematic crystalline liquid matter added with an dipole type additive is employed therefor. In addition, a mixture of alkoxyphenl-acetilchloride, 4-alkylphenylacetyl-chloride and 4-acetoxyphenyl-acetylchloride is employed and furthermore a nematic crystalline liquid matter mixed with a smectic crystalline liquid material is employed as the electro-optic matter.

Employed as the colloidal crystalline liquid are: colloidal suspension liquids prepared by dispersing in solvents such as water the organic or non-organic fine particles of, for instance, tungsten oxide, vanadium oxide, a needle-shaped non-homogenous crystal such as rock crystals, bismuth carbonate, lead crystal, herapathite, or polyvinylidenefluoride. These colloidal suspension liquids added with dipole type additives are used as the colloidal liquids.

Furthermore, an organic crystalline liquid of field effect type made from two or more of the materials listed below can be employed as the electro-optical material: cholesterol bromide, cholesterol chloride, cholesterol iodide, cholesterol nitrate, cholesterol nexanoate, cholesterol oleate, cholesterol linoleate, cholesterol linolenate, cholesterol nonanoate, cholesterol decanoate, cholesterol laurate, oleyl cholesterol carbonate, 2-(ethyl-hexyl) cholesterol carbonate, heptyl cholesterol carbonate, octyl cholesterol carbonate, nonyl cholesterol carbonate, decyl cholesterol carbonate, 2-(methoxyethyl) cholesterol carbonate, methyl cholesterol carbonate, buthyl cholesterol carbonate, and p-nonylphenyl cholesterol carbonate.

In some cases, suspension of organic pigment can be used as the electro-optical material.

In addition, generally, the film of electro-optical material 3 is on the order of from several to 20 μm in thickness, forming a white or colored image in a considerably low electric field.

As is apparent from FIG. 2, the first electrodes $a_1, a_2$ ... are connected respectively through resistors $R_1, R_2$ ... each having the same resistance, to one terminal of an external variable voltage source E$d$ while the second electrode $b_1$ is connected to the other terminal of the external variable voltage source E$d$. Thus the electric fields created between the respective first electrodes $a_1, a_2$ ... and the second electrode $b_1$ for the purpose of creating the electro-optic phenomenon of the electro-optic material 3 filled therebetween are different from one another. This external variable voltage source E$d$ may be any alternating current or direct current variable voltage source. A light source (not shown) is positioned above the top substrate 1.

Figure 3:
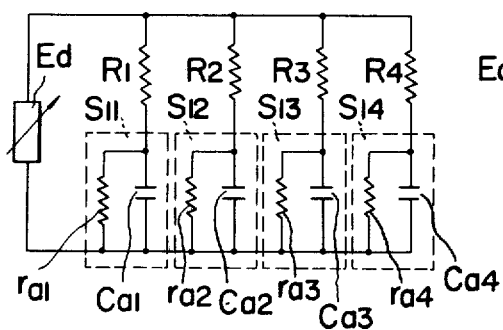
FIG. 3 is an equivalent circuit diagram of the example shown in FIGS. 1 and 2.

The operation of this electro-optic cell will be described with reference to FIG. 3 which illustrates the equivalent circuit of the cell. In FIG. 3, reference symbols $ra_1, ra_2$ ... are resistances existing between the respective first electrodes $a_1, a_2$ ... and the second electrode $b_1$. It is assumed that the ratio of the areas of the first electrodes $a_1, a_2$ ... is 1:4:9: .... The internal resistances between the respective first electrodes and the second electrode decrease with the increments of the areas of the first electrodes. Accordingly, $ra_1 > ra_2 > ra_3$ .... At the same time, the internal capacitances existing between the respective first electrodes and the second electrode become $ca_1 < ca_2 < ca_3$ .... Accordingly, the voltage division ratios of the resistances and capacitances $ra_1, ca_1; ra_2, ca_2; ra_3, ca_3$ ... with respect to the resistors $R_1, R_2$ ... are successively increased. It accordingly follows that the electro-optic cell shows electro-optic phenomena with different tones at the successive electrodes $a_1, a_2$ ....

Figure 14:
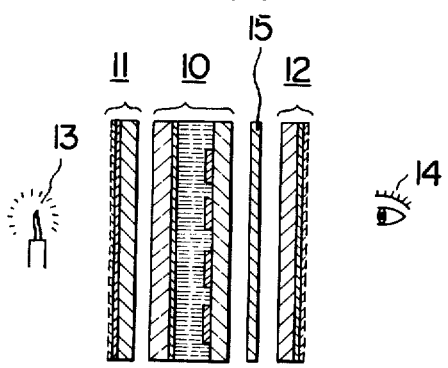

FIG. 14 illustrates the relationships between voltages (indicated on the ordinates) applied between the first and the second electrodes and light intensity ratios (indicated on the abscissas), in which reference symbols M and N indicate the characteristic curves of two kinds of nematic crystaline liquid materials. Accordingly, upon connection of the first electrodes and the second electrode to the voltage source, an electro-optic effect is produced in such a manner that the light intensity is gradually lowered in the order of the electrodes $a_1, a_2$ ... , as a result of which an image having an optical tone of light and shade is formed.

Figure 15:
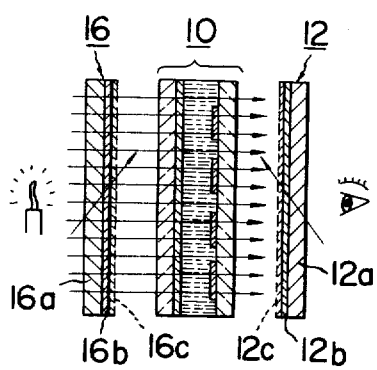

FIG. 15 shows the relationships between electric field strengths and light scattering wave lengths in the case where a cholesteric crystaline liquid matter of field-effect type consisting of a mixture of the following substances is employed as the electro-optical material 3:

| | |
|---|---|
| cholesterin bromide | 45% by weight |
| nonyl phenyl cholesterin | 25% by weight |
| cholesterin oleate | 30% by weight |

In this case, an image having color tones different from one another is formed in the order of the first electrodes $a_1, a_2$ ....

Figure 4:
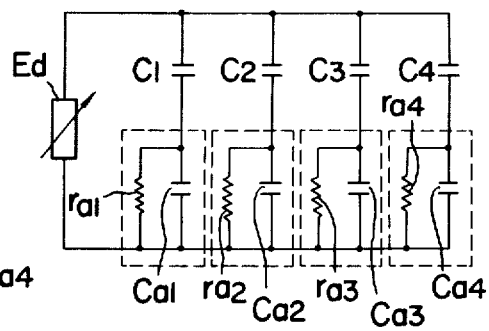
FIG. 4 is an equivalent circuit diagram of another example of the invention.

In the above described example, the resistors $R_1, R_2$ ... are employed. However, in the case where the voltage source is a.c., reactance elements such as capacitors may be employed instead of the resistors $R_1, R_2$ ... . FIG. 4 shows an equivalent circuit arranged on the basis of this idea, in which capacitors $C_1, C_2$ ... which are equal in capacitance to one another are employed instead of the resistors $R_1, R_2$ ..., respectively. FIGS. 3 and 4 are completely the same in function and operation.

In the embodiments of the electro-optical cells described with reference with FIGS. 1 to 4, the areas of the first electrodes $a_1, a_2$ ... are different stepwise from one another so as to change the internal resistances $ra_1, ra_2$ ... or capacitances $ca_1, ca_2$ ... between the first electrodes and the second electrode $b_1$.

However, field strengths between the first electrodes $a_1, a_2$ ... and the second electrode $b_1$ may be varied by the following method. That is, the areas of the first electrodes $a_1, a_2$ ... are made the same, but the resistors $R_1, R_2, R_3$ or capacitors $C_1, C_2, C_3$ connected in the circuit between the first and second electrodes are made different stepwise in value.

Figure 5:
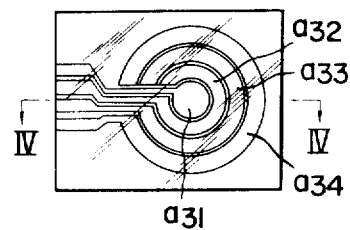
FIG. 5 is a plan view illustrating another embodiment of the invnetion.
Figure 6:
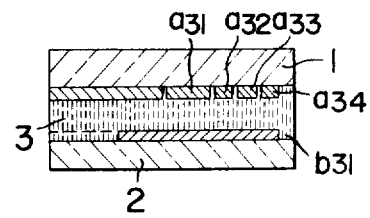
FIG. 6 is a sectional diagram taken along line IV—IV in FIG. 12.
Figure 7:
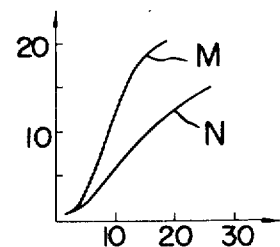
FIG. 7 is a graphical representation indicating the relationships between the voltages applied across first and second electrodes and the light intensity ratios.
Figure 8:
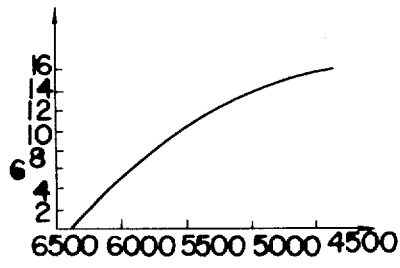
FIG. 8 is a graphical representation indicating the relationships between the light scattering wave lengths and the electric field strength.

Shown in FIGS. 5 and 6 is another example of an electro-optical cell according to this invention, which comprises: first electrodes $a_{31}, a_{32}$ ... concentrically arranged under a top substrate 1; and a second electrode $b_{31}$ provided on a bottom substrate 2, the second electrode being arranged to confront through an electro-optical material 3 the first electrodes.

In this example, the first electrodes $a_{31}, a_{32}$ ... are different stepwise in area. Accordingly, as was described with reference to FIGS. 3 and 4, for instance, if a voltage of a variable voltage source (not shown) is applied between the first electrodes $a_{31}, a_{32}$ ... and the second electrode $b_{31}$ through resistors or capacitors (not shown), an electro-optical phenomenon occurs with increase of the voltage of the variable voltage source beginning with the central part of the electro-optical cell.

Figure 10:
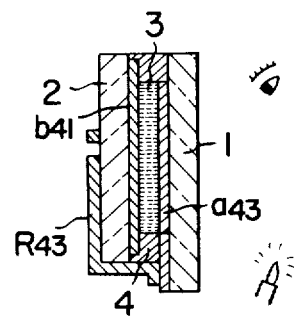
FIG. 10 is a cross-sectional diagram taken along line V—V in FIG. 16.
Figure 9:
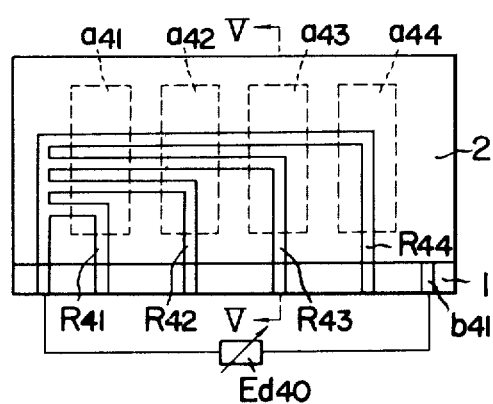
FIG. 9 is a bottom view illustrating another embodiment of the invention.

One example of the reflection type electro-optic cell according to this invention is shown with the bottom view in FIGS. 9 and 10, which comprises first electrodes $a_{41}, a_{42}$ ... which are different stepwise in area from one another, the first electrodes being provided under a top substrate 1, a second electrode $b_{41}$ of reflection type provided on a bottom substrate 2, and resistors $R_{41}, R_{42}$ formed of thick film resistance material by means of, for instance, vacuum evaporation or printing, the number of the resistors being the same as that of the first electrodes. One terminal of each of the resistors $R_{41}, R_{42}$ ... is connected to one terminal of a variable voltage source E$d_{40}$ while other terminals of the respective resistors are respective connected to the ends of the first electrodes $a_{41}, a_{42}$ ... and the second electrode $b_{41}$ is connected to the other terminal of the variable voltage source E$d_{40}$. An equivalent circuit connected to this reflection type electro-optical cell is the same as that shown in FIG. 3. In addition, the reflection type electro-optical cell is provided with a spacer 4 provided between the top substrate 1 and the bottom substrate 2.

Figure 12:
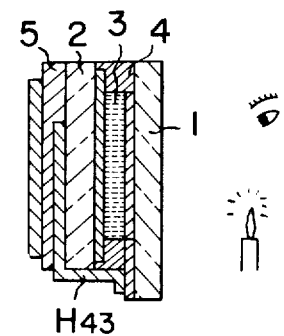
FIG. 12 is a cross-sectional diagram taken along line VI—VI in FIG. 17.
Figure 11:
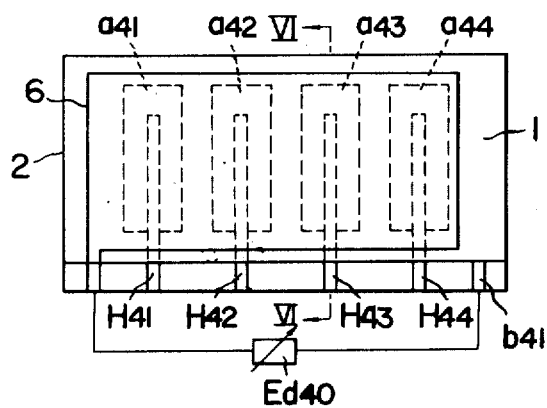
FIG. 11 is a bottom view illustrating another embodiment of the invention.
Figure 13:
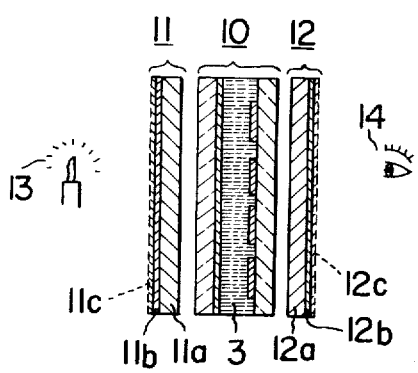
FIGS. 13 through 18 are cross-sectional diagrams respectively illustrating various embodiments of the invention.

A modification of the reflection type electro-optical cell shown in FIGS. 9 and 10 is shown in FIGS. 11 and 12 in which the resistors are replaced by capacitors. More specifically, in this modification, first electrode plates $H_{41}, H_{42}$ ... which are the same in number as that of the first electrodes $a_{41}, a_{42}$ ... are provided on the opposite side of the bottom substrate 2. These electrode plates are connected to the ends of the first electrodes $a_{41}, a_{42}$ ... respectively. An insulating layer 5 of high dielectric value, such as a film of silicon dioxide, organic silicon compound, chromium oxide, germanium oxide, magnesium oxide, magnesium fluoride or the like, is provided over the bottom substrate. Over the insulating layer 5 there is provided a second electrode plate 6 the end part of which is connected to one terminal of a variable voltage source $Ed_{40}$. The other terminal of the variable voltage source $Ed_{40}$ is connected to the end part of the second electrode $b_{41}$. An equivalent circuit connected to this reflection type electro-optical cell is the same as that shown in FIG. 4.

In these cells, in order to show an electro-optic phenomenon, the areas of the first electrodes are made different from one another so as to causes different external input voltages to be applied between the first and second electrodes. Instead of this method, the external input voltages applied to the respective first electrodes may be made different with a change of the distance between the first and second electrodes for the purpose of showing the electro-optic phenomenon.

In the electro-optical cell shown in FIGS. 1 through 12, an electric field is applied between the first electrode and the second electrode so that the molecules of an electro-optical material such as a nematic crystalline liquid material are subjected to turbulance so as to create light scattering and thereby form a white image (or monochrome image), or, as in the case where an electro-optical material such as a cholesteric crystalline liquid material is employed, only the light having a particular wave length is selectively reflected. In other words a colored image is made so that the strengths of electric fields between the first and second electrodes are different from one another thereby changing the shape of an image on the electro-optical cell.

In this connection, the shape or configuration of the image can be changed by the following method. That is, under the fieldless condition between both electrodes when applicable, the longitudinal directions of the molecules in the electro-optical material are uniformaly arranged on an electrode surface and the field strength between the first and second electrodes is changed partially so that the molecular arrangement of the electro-optical material is changed. In this way, the shape of the image can be changed by the utilization of only the change in the molecular arrangement. In this case a pair of polarizing plates should be provided on both side of the electro-optical cell.

Shown in FIGS. 13 to 18 are electro-optical cells formed according to the above-described concept.

One of the electro-optical cells described above is shown in FIG. 13, which comprises a pair of linear polarizing plates 11 and 12 provided on the both sides of an electro-optical cell 10 shown in FIGS. 1 through 12. This electro-optical cell 10 further comprises: substrates 11a, 12a; linear polarizing films 11b and 12b; and protective films 11c and 12c for the linear polarizing films.

The functional operation of this electro-optical cell 10 will be described.

It is assumed that the electro-optical cell 10 as shown in FIGS. 1 to 12 is arranged between the linear polarizing plates 11 and 12. The electro-optical cell 10 in which the longitudinal direction of a molecule in an electro-optical matter is greatly different from the direction of a dipole thereof, and each molecule is uniformly arranged as a homeotropic phase in a direction perpendicular to an electrode surface under the fieldless conditions, shows an optical isotropy. When such an electro-optical cell 10 is arranged between the linear polarizing plates 11 and 12 formed cross nicol to each other, light from a light source 13 passes through the linear polarizing plate 11 and then the electro-optical cell 10 as it is, but it is blocked by the linear polarizing plate 12; that is, it will not reach an observer 14, and therefore anyone who stands near the observer will see it black. The term "cross-nicol" as used in this specification means that the polarization directions of the two polarizers are crossed with respect to each other. Now, if an electric field is applied between the first and second electrodes confronted in the electro-optical cell 10 and the field strength exceeds the threshold value of the electro-optical cell 10, the molecules of the electro-optical matter 3 gradually change the direction of dipoles to the direction of the electric field, as a result of which the arrangement of the molecules is twisted. In the region where the electric field strength is low, only the light having a wave length of, for instance, blue, green . . . red . . . blue, green . . . is selectively passed through. If the electric field strength is made somewhat higher, the condition of turbulent flow takes place with the molecules. As a result, the light of all wave lengths from the light source 13 passes through all of the linear polarizing plate 11, the electro-optical cell 10 and the linear polarizing plate 12 simultaneously and reaches the observer 14. Accordingly, if we see it standing at a position approximately in front of the observer, we can clearly see an image corresponding to the shape of the electrodes in the black background.

Furthermore, if an electro-optical cell 10 is formed in which an electro-optical material has the longitudinal direction of a molecule greatly different from the direction of a dipole, and under the fieldless conditions the molecules are uniformly arranged as a homogenious phase horizontally with respect to an electrode surface, and the cell thus formed is arranged between two linear polarizing plates 11 and 12 formed cross nicol to each other; or if an electro-optical cell 10 is formed in which under the fieldless conditions all the molecules are horizontally arranged with respect to the electrode surface and the molecules thus arranged as a homogenious phase are made to have twist alignment in a helical state, being different by 90° from each other in the opposite electrode surface, and the cell thus formed is arranged between two linear polarizing plates 11 and 12 whose polarization directions are in parallel with each other; the application of an electric field between the opposed electrodes causes the molecules of the electro-optical cell to have a state of turbulent flow and to thereby present a optical anisotropy. As a result, the observer can see a white image corresponding to the electrodes.

Furthermore, in the case where an electro-optical cell 10 having a helical structure is formed in such a manner that in its electro-optical material 3 the longitudinal direction of a molecule is approximately the same as the direction of a dipole, under the fieldless conditions all the molecules being arranged horizontally with respect to an electrode surface, the arrangement of the molecules being homogeniously three-dimensionally slightly twisted so as to be different by 90° with respect to opposed electrode surfaces and the electro-optical cell 10 thus formed is arranged between two linear polarizing plates 11 and 12 whose polarization directions are in parallel with each other; it is not possible to cause the turbulent flow of molecules by the application of an electric field between the opposed electrodes; however, the action of the electric field changes the molecular arrangement of the electro-optical material 3 and therefore the observer can observe a white image as an image corresponding to the shape of the electrodes in the black background. If the polarization directions of the linear polarizing plates 11 and 12 are formed cross nicol to each other in the fieldless condition between the electrodes, the light of all wave lengths from the light source 13 reaches the observer side passing through the cell and both polarizers and when an electric field is applied between the electrodes, the molecular arrangement is changed, as a result of which the observer can observe a black image, as an image corresponding to the shape of the electrodes, in the white background.

Next, it is assumed that the electro-optical cell is arranged between the linear polarizing plates 11 and 12.

More specifically, an electro-optical cell 10 is formed in which in its electro-optical material 3 the longitudinal direction of a molecule is greatly different from the direction of a dipole component force and under the fieldless conditions the molecules are uniformly aligned as so homogeneous phase horizontally with respect to an electrode surface, and the electro-optical cell 10 thus formed is positioned between the linear polarizing plates 11 and 12 whose polarization directions are perpendicular to each other. Under these conditions, if an electric field is applied between the electrodes, it causes the turbulent flow of molecules in the electro-optical matter 3, which shows an optical anisotropy. As a result, the observer can see a white image, as an image corresponding to the shape of the electrodes, in the black background.

Similarly as in the above case, an electro-optical cell 10 may be formed in which in its electro-optical matter 3 the longitudinal direction of a molecule is greatly different from the direction of a dipole component force and under the fieldless conditions the molecules are aligned as so homogeneous phase horizontally to be twisted with respect to an electrode surface, and the electro-optical cell 10 thus formed is positioned between two linear polarizing plates 11 and 12 whose polarization directions are in parallel with each other. Under these conditions, if an electric field is applied between the opposed electrodes, the observer can see a white image as an image corresponding to the shape of the electrodes.

In addition, in the case where an electro-optical cell 10 is formed in which in its electro-optical material 3 the longitudinal direction of a molecule is approximately the same as the direction of a dipole component force and under the fieldless conditions the molecules are aligned as so homogeneous phase horizontally with respect to an electrode surface, the molecular alignment directions differing by 90° in the vicinity of the inner wall of substrates, and the electro-optical cell 10 thus formed is positioned between two linear polarizing plates 11 and 12 whose polarization directions are in parallel with each other; it is not possible to have the molecular turbulent flow in the electro-optical material 3 by the application of an electric field between the opposed electrodes; however, the action of the electric field changes the molecular alignment in the electro-optical material 3 as a result of which the observer can see a white image, as and image corresponding to the shape of the electrodes, in the black background.

In this connection, if the linear polarizing plates 11 and 12 are arranged so that their polarization directions form 90° thereby to form a cross nicol to each other, the molecular alignment in the electro-optical material 3 is changed by the application of an electric field between the opposed electrodes, as a result of which the observer can see a black image corresponding to the shape of the electrodes in the white background.

In the case where the molecules of an electro-optical material are regularly aligned under the fieldless conditions while the partial application of the different electric fields between the first and second electrodes cause the molecular turbulent current in the electro-optical material, as is shown in FIG. 14 a color filter 15 is provided between the electro-optical cell 10 and the linear polarizing plate 12 so that an image formed by the electrodes is colorful.

The functional operation of the electro-optical cell shown in FIG. 14 will be briefly described. When under the fieldless conditions the molecules of the electro-optical material 3 are regularly aligned and the electro-optical material 3 therefore shows an optical isotropy, the light from the light source 13 passes through the linear polarizing plate 11, the electro-optical cell 10 and the color filter 15, but cannot pass through the linear polarizing plate 12. Accordingly, what is seen by the observer 14 is black. Now, when an electric field is applied between the electrodes opposed to each other so as to cause the molecular turbulent flow in the electro-optical material 3, the electro-optical material 3 shows an optical anisotropy. As a result, the light from the light source 13 can pass through the linear polarizing plate 11, the electro-optical cell 10, the color filter 15 and the linear polarizing plate 12, thereby indicating a colorful image formed by the electrodes.

In the above described embodiment of this invention, the color filter 15 is provided between the electro-optical cell 10 and the linear polarizing plate 12. However, the color filter 15 may be provided between the electro-optical cell 10 and the linear polarizing plate 11. In addition, the color filter 15 can be provided on the left side of the linear polarizing plate 11. If necessary, a colored light source may be employed instead of the provision of the color filter 15. Furthermore, if it is dark on the observer side, the color filter 15 may be provided on the side facing to the observer. The polarizing plates are not limited to the linear polarizing plates only, that is, other type polarizing plates can be employed as the polarizing plates.

Another example of the invention is shown in FIG. 15, in which an electro-optical cell 10, a linear polarizing plate 12 and a colored linear polarizing plate 16 which serves as both a color filter and a linear polarizing plate and is provided instead of the color filter are combined so as to display a colorful image. In this colored linear polarizing plate 16, a colored linear polarizing film 16b is formed over one surface of its substrate 16a. Furthermore, a protective film 16c is formed over the colored linear polarizing film 16b.

Figure 16:
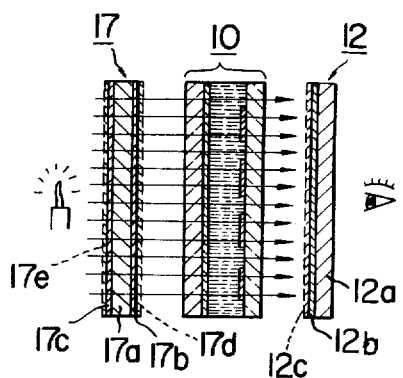

Shown in FIG. 16 is another embodiment of the invention which comprises a compound colored linear polarizing plate 17, an electro-optical cell 10 and a linear polarizing plate 12. The compound colored linear polarizing plate 17 is provided with colored linear polarizing films 17b and 17c formed on both sides of its substrate 17a. The compound colored linear polarizing films 17b and 17c are protected by protective films 17d and 17e, respectively. In this example shown in FIG. 16, the optical axes of the compound colored linear polarizing films 17b and 17c are intersected perpendicularly to each other, and when no electric field is applied to the cell the observer can see a particular color on the whole surface. Then, when an electric field is applied to the electro-optical cell 10, a single color image but different from that appearing in the case when no electric field is applied appears when the electric field is high.

Figure 17:
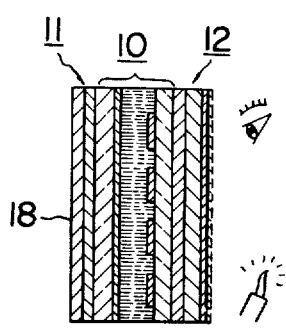

Shown in FIG. 17 is one modification of the electro-optical cell shown in FIG. 14, in which a light reflecting layer 18 is provided on one side of the polarizing plate 11. This is a reflection type electro-optical cell.

Figure 18:
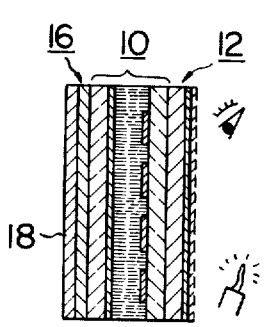

Shown in FIG. 18 is one modification of the electro-optical cell shown in FIG. 16, in which a light reflecting layer 18 is provided on one side of the colored polarizing plate 16. This is a reflection type electro-optical cell, too.

Figure 19:
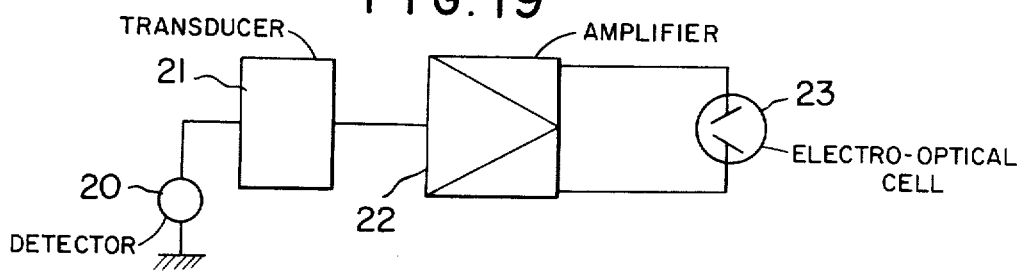
FIGS. 19 through 21 are block diagrams respectively illustrating different embodiments of the invention.

Illustrated in FIG. 19 is a block diagram illustrating a device in which the electro-optical cell as described above is employed as an instrument for indicating analog data of a tachometer, a thermometer, a pressure gauge, or a photometer. The device shown in FIG. 19 comprises: a detector 20 for detecting temperature, weight, intensity of radiation, and the like; a transducer 21 for converting an output from the detector 20 into an electrical signal; and an amplifier 22 for applying an output from the transducer 21 to the first and second electrode of the electro-optical cell 23 as described previously. The signal data indicating instrument can be formed considerably thin since it is constituted only by the electro-optical cell 23 which is relatively thin and the electrical circuit provided for the cell.

Figure 20:
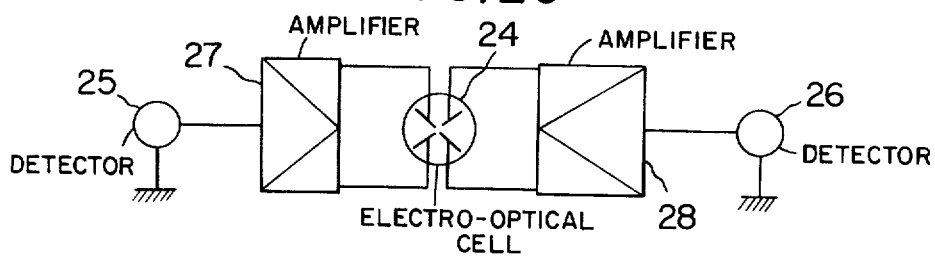

Shown in FIG. 20 is a device for comparing and displaying two analog data, such as right and left signals produced from a stereophonic device by employing the electro-optical cell 24 according to the present invention. The first electrodes thereof are divided into, for instance, two groups. The device comprises: detectors 25 and 26 for detecting two analog data; and amplifiers 27 and 28 provided for the detectors 25 and 26 respectively, the amplifiers applying their outputs between the first and second electrode of each group in the electro-optical cell described above.

Figure 21:
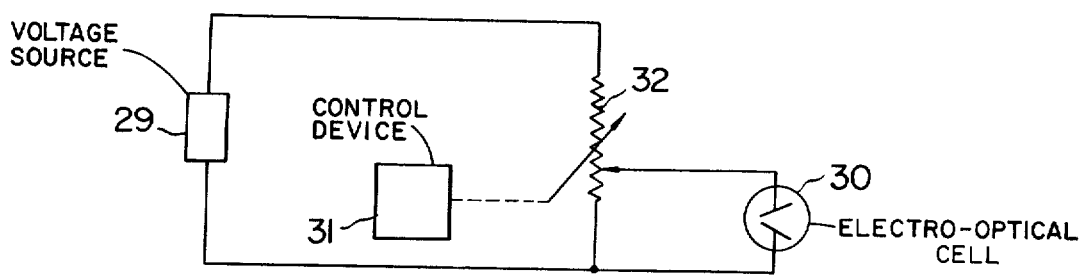

With reference to FIG. 21, there is shown a device which employs the above-described electro-optical cell 30 for the purpose of detecting the fact that the output voltage of a voltage source 29 reaches a predetermined level, the output voltage being applied to the electro-optical cell 30 through a variable resistor 32 provided with a suitable control device 31.

Figure 22:
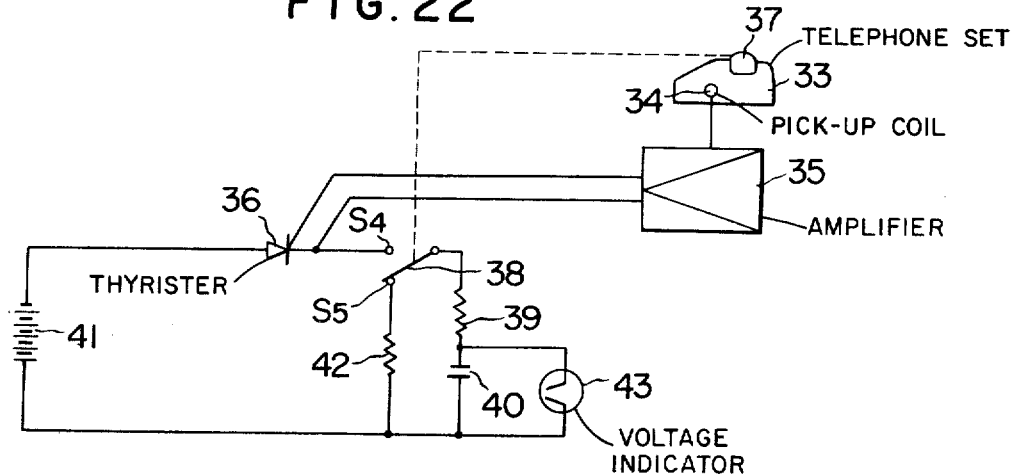
FIG. 22 is a circuit diagram illustrating the other embodiment of the invnetion.

FIG. 22 illustrates a device which employs the abovedescribed cell for the indication of transmission time of a telephone service. The device shown in FIG. 22 comprises: a telephone set 33; a pick-up coil 34 for detecting the electrical level of the transmission circuit; and an amplifier 35 provided for the output of the pick-up coil 34, the amplifier 35 applying its output to the gate of a thyristor 36. The thyristor 36 is connected to a timer circuit consisting of a resistor 39 and capacitor 40 through a contact $S_4$ of a switch 38. The switch is set on when the receiver, or handset 37, of the telephone set 33 is unhooked. The device is further provided with a power source 41. A normally closed contact $S_5$ of the switch 38 is connected to a dicharge resistor 42 of the capacitor 40. Both terminals of the capacitor 40 are connected to a voltage indicator 43 comprising an electro-optical material.

The operation of this device is as follows: Upon unhooking the handset 37 of the telephone set 33, the contact $S_4$ is closed. Under these conditions, the dial is turned and a person called unhooks the handset of his telephone set, thus completing the transmission circuit. As a result, the electrical level of the transmission circuit is changed, and the change of the electrical level is detected by the pick-up coil 34. The detecting output of the pick-up coil 34 is amplified by the amplifier 35 whereby the thyristor 36 is turned conductive. Accordingly, charging the capacitor 40 is started and the potential across the terminals of the capacitor 40 gradually increases. As a result, the electrodes of the voltage indicator 43 show electro-optical phenomena beginning with the electrode whose external input voltage necessary for showing an electro-optical phenomenon is the lowest, thereby indicating the lapse of a transmission time. In this connection, the electrical level of the transmission circuit may be detected by connecting the pick-up coil directly to the telephone set 33.

We claim:

1. An electro-optic device comprising a first transparent substrate, a second substrate juxtaposed to the first substrate, a body of electro-optically variable liquid disposed between said substrates, a plurality of first electrodes disposed on the surface of the first substrate facing the second substrate, each individual one of said plurality of first electrodes having an area different from the area of the others, a second electrode provided on the surface of the second substrate facing the first substrate, said liquid interposing internal impedance between said first electrodes and said second electrode, and a plurality of impedance elements of equal impedance value, external to said substrates and liquid; each of said first electrodes being connected through a respective one of said impedance elements to a terminal of a voltage source, and said second electrode being connected to another terminal of the voltage source, so that there are a plurality of parallel circuits each comprising a respective one of said impedance elements in series with the respective internal impedance between a respective one of said first electrodes and said second electrode, whereby in each of said parallel circuits a first part of the voltage supplied from the voltage source exists across the respective internal impedance and a second part of the voltage from the voltage source exists across the respective impedance element, the ratios of the first part to the second part of the voltage being different at the different respective parallel circuits.

2. An electro-optic device as claimed in claim 1 in which said impedance elements are resistors.

3. An electric-optic device as claimed in claim 1 in which said impedance elements are reactance elements.

4. An electric-optic device as claimed in claim 3 in which said reactance elements are capacitors.

* * * * *